(12) United States Patent
Kang et al.

(10) Patent No.: US 10,762,838 B2
(45) Date of Patent: Sep. 1, 2020

(54) DISPLAY DEVICE

(71) Applicant: LG DISPLAY CO., LTD., Seoul (KR)

(72) Inventors: Gyutae Kang, Goyang-si (KR); NamKil Park, Paju-si (KR); Mardin Kwon, Seoul (KR); Seongwoong Jeong, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 79 days.

(21) Appl. No.: 16/108,544

(22) Filed: Aug. 22, 2018

(65) Prior Publication Data

US 2019/0088198 A1    Mar. 21, 2019

(30) Foreign Application Priority Data

Sep. 15, 2017 (KR) .................. 10-2017-0118521

(51) Int. Cl.
*G09G 3/3233* (2016.01)
*H01L 27/32* (2006.01)
*G09G 3/3216* (2016.01)

(52) U.S. Cl.
CPC ......... *G09G 3/3233* (2013.01); *G09G 3/3216* (2013.01); *H01L 27/3276* (2013.01); *G09G 2320/0233* (2013.01)

(58) Field of Classification Search
CPC ......... G09G 2320/0233; G09G 3/3216; G09G 3/3233; H01L 27/3276
See application file for complete search history.

(56) References Cited

U.S. PATENT DOCUMENTS

| | | | | |
|---|---|---|---|---|
| 2005/0057461 A1* | 3/2005 | Suh | ...................... | G09G 3/3225 345/76 |
| 2006/0044237 A1* | 3/2006 | Lee | ...................... | G09G 3/3233 345/82 |
| 2011/0102402 A1* | 5/2011 | Han | ...................... | H01L 27/3279 345/211 |
| 2011/0128268 A1* | 6/2011 | Kim | ...................... | G09G 3/3225 345/211 |
| 2011/0241563 A1* | 10/2011 | Kim | ...................... | G09G 3/3225 315/291 |

FOREIGN PATENT DOCUMENTS

KR    10-0831306 B1    5/2008

* cited by examiner

*Primary Examiner* — Dmitriy Bolotin
(74) *Attorney, Agent, or Firm* — Birch, Stewart, Kolasch & Birch, LLP

(57) ABSTRACT

A display device with a substrate including an active area having a plurality of pixels, and an inactive area adjacent to the active area; a plurality of power lines in the active area, connected to the plurality of pixels; a first power link line in the inactive area configured to receive power voltage and transmit the power voltage to the plurality of power lines; and a first hole disposed in the first power link line.

21 Claims, 7 Drawing Sheets

DISPLAY DEVICE

CROSS-REFERENCE TO RELATED APPLICATIONS

This application claims the priority of Korean Patent Application No. 10-2017-0118521 filed in the Republic of Korea on Sep. 15, 2017, the entirety of which is incorporated herein by reference.

BACKGROUND OF THE INVENTION

Field of the Invention

The present disclosure relates to a display device, and more particularly, to a display device which improves upon supply routes for transmitting power voltage to a plurality of power lines, in order to reduce power voltage drop and improve luminance uniformity.

Description of the Related Art

The next generation of display devices, such as a liquid crystal displays, organic light emitting diode displays, and quantum dot displays, are thin and power efficient.

These display devices typically include a driver IC that transmits power voltage for driving a plurality of pixels. The driver IC transmits power voltage to these pixels through power lines disposed in the display device.

However, the power voltage provided by the driver IC experiences a drop in power while passing through these power lines, and the power voltage provided to the plurality of pixels is not uniform, resulting in the deterioration of the luminance uniformity of the display device. Therefore, a device capable of providing uniform power voltage to the plurality of pixels is desired.

SUMMARY OF THE INVENTION

The inventors of the present disclosure initially designed the center of the display device to be the initial lead-in point of the power voltage to increase the degree of freedom to design an inactive area in the display device. Further, a horizontal power line extending from the center to the sides was disposed above the display panel to more uniformly transmit power voltage throughout the entire active area.

However, the amount of power voltage drop experienced at the center of the horizontal power line would be the smallest, while the amount of power voltage drop experienced along the outer peripheries of the horizontal power line would be the largest. Therefore, power voltage would not be uniformly supplied to the plurality of pixels due to the differences in the amount of power voltage drop along each of the plurality of power lines. The luminance of the plurality of pixels becomes non-uniform due to the differences in the amount of power voltage reaching them, and more voltage is typically needed to be applied to compensate for this power voltage drop.

Therefore, the inventors of the present disclosure invented a display device incorporating a horizontal power line with a novel structure capable of reducing the difference in power voltage drop among the plurality of power lines.

An object achieved by the present disclosure is to improve luminance uniformity by minimizing the difference in the amount of power voltage drop through the sides of the display device.

Another object achieved by the present disclosure is improved luminance uniformity by increasing the uniformity of power voltage drop by adjusting the resistance along the horizontal power line.

Objects of the present disclosure are not limited to the above-mentioned objects, and other objects not mentioned above can be clearly understood by those skilled in the art from the following descriptions.

According to an aspect of the present disclosure, a display device includes: a substrate, which includes an active area having a plurality of pixels and an inactive area adjacent to the active area, a plurality of power lines disposed in the active area to transmit power voltage to a plurality of pixels; and a first power link line disposed in the inactive area, which incorporates at least one hole and is connected to the plurality of power lines. Accordingly, the resistance of the route through which the power voltage is supplied is adjusted to reduce the difference in the amount of power voltage drop and improve luminance uniformity.

According to another aspect of the present disclosure, a display device includes: a substrate which includes an active area and an adjacent inactive area, a plurality of power lines in the active area, a first power link line in the inactive area connected to the plurality of power lines, and a second power link line extending from the first power link line in a different direction from the first power link line, in which the first power link line includes a hole which increases the length of the route through which power voltage is transmitted to a set of power lines that would otherwise have the shortest route from the second power link line, among the plurality of power lines.

Other detailed matters of the embodiments are included in the detailed description and the drawings.

According to the present disclosure, the difference of the amount of power voltage drop is reduced by adjusting the resistance in the horizontal power line, thereby improving power voltage uniformity.

According to the present disclosure, when power voltage is transmitted to the left and right sides of the display device, the difference in power voltage caused by power voltage drop is minimized, thus improving luminance uniformity.

According to the present disclosure, resistance in the horizontal power line is adjusted so that the uniformity of power voltage drop amongst the power lines is improved. Therefore, greater freedom is afforded to the design, positioning, and arrangement of the power lines and driver IC.

The effects according to the present disclosure are not limited to the contents exemplified above, and other various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
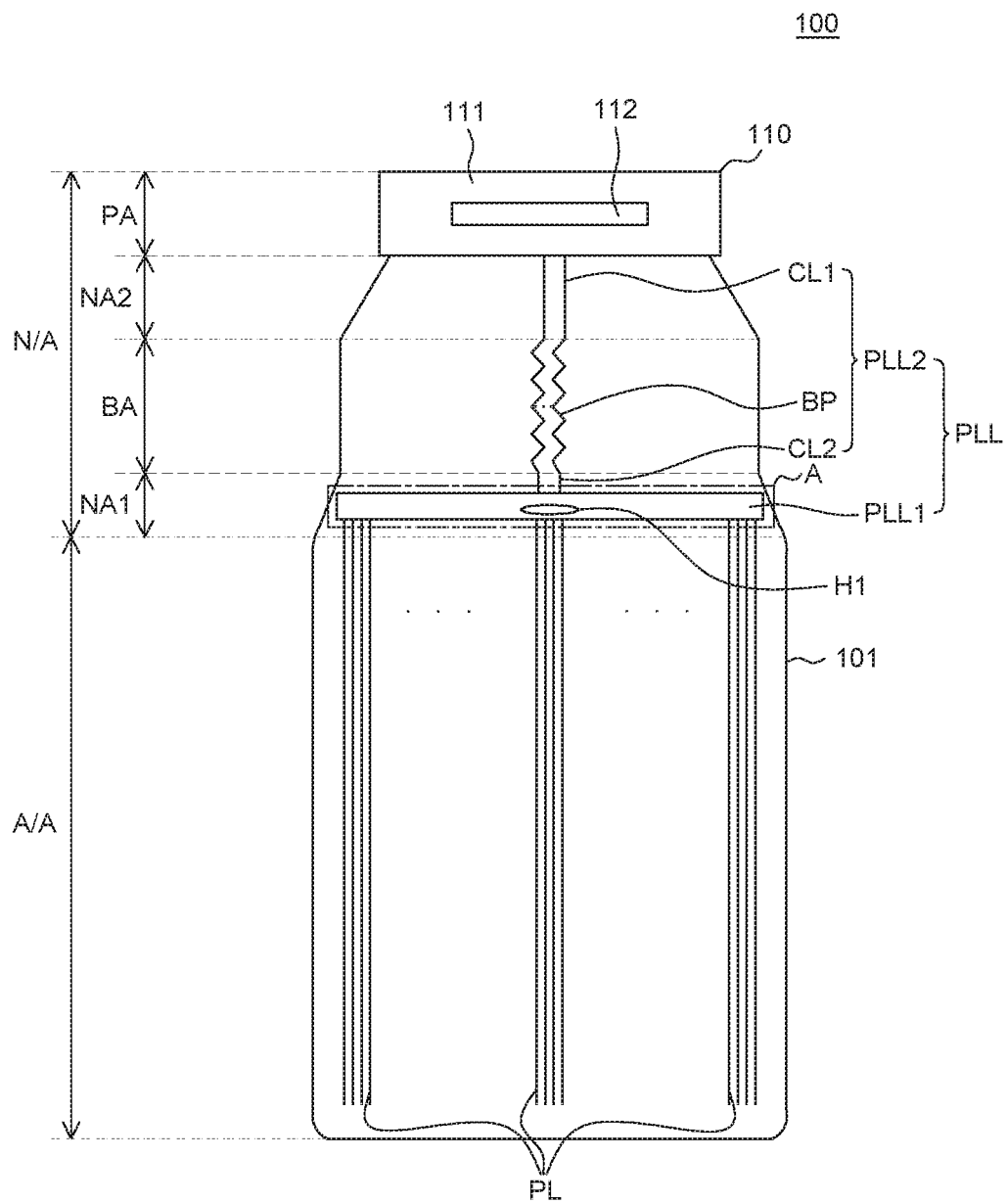
FIG. 1 is a plan view of a display device according to an embodiment of the present disclosure.

The advantages and features of the present disclosure, as well as the means by which these advantages and features are realized will be clear by referring to the embodiments described below in more detail, together with the accompanying drawings. The present disclosure is not limited to the embodiments disclosed herein, but may be implemented in various forms. The embodiments are provided by way of example only, so that those skilled in the art can fully understand the present disclosure. The scope of the present disclosure will be defined only by the scope of the appended claims.

The shapes, sizes, ratios, angles, numbers, and the like in the accompanying drawings illustrating the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. Terms such as "including," "having," and "comprising," as used herein are generally intended to allow other components to be added unless the terms are used with the term "only." Any singular references may also be applied in the plural sense, unless expressly stated otherwise.

Descriptions and measurements of components should be interpreted to include an ordinary error range, even if not expressly stated.

When terms such as "on," "above," "below," and "next," are used to describe the position or relation between components, one or more other components may be positioned between said components, unless the terms are used with the term "immediately" or "directly."

For example, when an element or layer is disposed "on" another element or layer, another layer or another element may be interposed directly on the other element or there between.

Although the terms "first," "second," and the like are used to describe various components, the positioning or order of these components are not confined by these terms. These terms are merely used to distinguish the components. Therefore, the first component to be mentioned below may be referred to as a second component in the technical concept of the present disclosure.

Like reference numerals generally denote like elements throughout the specification.

The size and thickness of each component illustrated in the drawings are illustrated for convenience of description, and the present disclosure is not limited to the relative size and thickness of the components as illustrated.

The features of the various embodiments of the present disclosure can be either partially or entirely adhered to or combined with each other, and can be assembled and operated in technically various ways, and the embodiments can be implemented independent of or in association with each other.

Hereinafter, a display device according to the embodiments of the present disclosure will be described in detail with reference to the accompanying drawings.

FIG. 1 is a plan view of a display device according to an embodiment of the present disclosure. Referring to FIG. 1, a display device 100 includes a substrate 101, a flexible film 110, a power link line PLL, and a power line PL.

The substrate 101 is a base member for supporting various components of the display device 100 and may be configured by an insulating material. For example, the substrate 101 may include glass or a plastic material such as polyimide.

Referring to FIG. 1, the substrate 101 includes an active area A/A and an inactive area N/A.

In the active area A/A, images are displayed and a plurality of pixels is disposed. In the active area A/A, the display elements for displaying images and driving units for driving the display elements may be disposed. For example, when the display device 100 is an organic light emitting display device, the display element may be an organic light emitting element which includes an anode, an organic layer, and a cathode. The driving units may be configured by various components for driving the organic light emitting element, such as a power line PL, gate line, data line, thin film transistor, and storage capacitor. Hereinafter, for the convenience of description, it is assumed that the display device 100 is an organic light emitting display device, but the display device 100 is not limited to organic light emitting display devices.

In the inactive area N/A, an image is not displayed and various wiring lines and circuits for driving a display element of the active area A/A are disposed. For example, a driver IC 112 or a power link line PLL may be disposed in the inactive area N/A.

The inactive area N/A may be an area extending from the active area A/A, but is not limited thereto and may be an area surrounding the active area A/A.

The inactive area N/A includes a first inactive area NA1, a bending area BA, a second inactive area NA2, and a pad area PA. The first inactive area NA1 extends from the active area A/A. The bending area BA extends from the first inactive area NA1 and may be bent. The second inactive area NA2 extends from the bending area BA and the pad area PA extends from the second inactive area NA2. In the pad area PA, a pad to be connected to a driver IC 112 is disposed.

The flexible film 110 is a film in which various components are disposed on a flexible base film 111 and transmits signals to pixels of the active area A/A. The flexible film 110 is disposed in the pad area PA of the inactive area N/A. The flexible film 110 transmits power voltage or data voltage to the pixels of the active area A/A through the pad disposed in the pad area PA. The flexible film 110 includes a base film 111 and a driver IC 112. Further, various components may be additionally disposed on the flexible film 110. In FIG. 1, a printed circuit board connected to the flexible film 110 is omitted for convenience.

The base film 111 is a layer that supports various components of the flexible film 110. The base film 111 may be formed of an insulating material, for example, a flexible insulating material.

The driver IC 112 is a component that processes data for displaying images and a driving signal for processing the data. The driver IC 112 may be mounted on the substrate 101 of the display device by a variety of techniques, such as chip on glass (COG), chip on film (COF), and tape carrier package (TCP). In FIG. 1, the driver IC 112 is mounted on the flexible film 110 by a chip on film technique, but is not limited thereto.

A plurality of power lines PL is disposed in the active area A/A and a power link line PLL is disposed in the inactive area N/A. The plurality of power lines PL and the power link lines PLL transmit power voltage from the driver IC 112 to the plurality of pixels of the active area A/A.

For example, the power link line PLL disposed in the inactive area N/A connects the driver IC 112 to the plurality of power lines PL disposed in the active area A/A. Power voltage is transmitted from the driver IC 112 to the plurality of power lines PL through the power link line PLL. Finally, power voltage is transmitted to the plurality of pixels connected to the plurality of power lines PL.

The plurality of power lines PL and the power link line PLL may be formed of a conductive material. For example, the plurality of power lines PL and the power link line PLL may be formed of one of the various materials used to manufacture an organic light emitting element, gate electrode, source electrode, or a drain electrode of a thin film transistor in the active area A/A. For example, the plurality of power lines PL and the power link line PLL may be configured as a single layer or multiple layers. The plurality of power lines PL and the power link line PLL may be formed of molybdenum (Mo), chrome (Cr), titanium (Ti), nickel (Ni), neodymium (Nd), copper (Cu), or an alloy of silver (Ag) and magnesium (Mg), but is not limited thereto.

In FIG. 1, it is illustrated that only the plurality of power lines PL and the power link line PLL are disposed on the substrate 101, but other various lines, such as a data line, data link line, and a gate line may be further disposed thereon.

The power link line PLL includes a first power link line PLL1 and a second power link line PLL2. The first power link line PLL1 is disposed in the first inactive area NA1. The second power link line PLL2 is disposed in the second inactive area NA2 and extends from the first inactive area NA1 to the pad area PA.

For example, the second power link line PLL2 includes a first connection line CL1 disposed in the pad area PA and the second inactive area NA2, a plurality of bending patterns BP disposed in the bending area BA, and a second connection line CL2 disposed in the first inactive area NA1.

The first connection line CL1 is disposed in the center portions of the pad area PA and the second inactive area NA2. The first connection line CL1 is connected to a pad connected to the driver IC 112 and transmits power voltage to the plurality of bending patterns BP disposed in the bending area BA.

The plurality of bending patterns BP is disposed in a center portion of the bending area BA. The bending area BA is an area which may be bent in the final product, and so cracks may form on the plurality of bending patterns BP disposed in the bending area BA due to stress from such bending. Therefore, in order to minimize cracks, the plurality of bending patterns BP may be formed into a pattern of a specific shape. For example, the plurality of bending patterns BP may employ repeated patterns having at least one of a diamond, rhombic, zigzag, or circular shape, but is not limited thereto. The plurality of bending patterns BP may employ a variety of shapes to minimize stress and cracks on the plurality of bending patterns BP.

Further, even though the plurality of bending patterns BP is disposed in the bending area BA in FIG. 1, the plurality of bending patterns BP may be disposed to extend from the bending area BA into the first inactive area NA1 and/or the second inactive area NA2, but is not limited thereto.

The second connection line CL2 is disposed in the first inactive area NA1 and is connected to the plurality of bending patterns BP and the first power link line PLL1. The second connection line CL2 extends from the plurality of bending patterns BP toward the first inactive area NA1 and is disposed in the center portion of the first inactive area NA1.

The first power link line PLL1 transmits power voltage transmitted through the first connection line CL1 and the plurality of bending patterns BP to the plurality of power lines PL of the active area A/A. The first power link line PLL1 is disposed in the first inactive area NA1 and extends to both ends (e.g., opposite sides) of the first inactive area NA1. The first power link line PLL1 includes a first hole H1 disposed in the center portion of the first inactive area NAL The first hole H1 will be described below with reference to FIG. 2.

The first power link line PLL1 is connected to the plurality of bending patterns BP. For example, the first power link line PLL1 is connected to the plurality of bending patterns BP through the second connection line CL2.

The second power link line PLL2 extends in a different direction from the first power link line PLL1. For example, as illustrated in FIG. 1, the first power link line PLL1 extends horizontally in the left and right directions, while the second power link line PLL2 extends vertically, in a direction perpendicular to PLL1.

The plurality of power lines PL is disposed in the active area A/A. The ends of the plurality of power lines PL may extend into the first inactive area NA1 to connect to the first power link line PLL1.

According to the configuration of the power link line PLL as described above, the power voltage transmitted from the driver IC 112 is sequentially transmitted to the first connection line CL1, the plurality of bending patterns BP, the second connection line CL2, the first power link line PLL1, and the plurality of power lines PL, and transmitted to the plurality of pixels disposed in the active area A/A.

Hereinafter, the first hole H1 of the first power link line PLL1 will be described with reference to FIG. 2.

Figure 2:
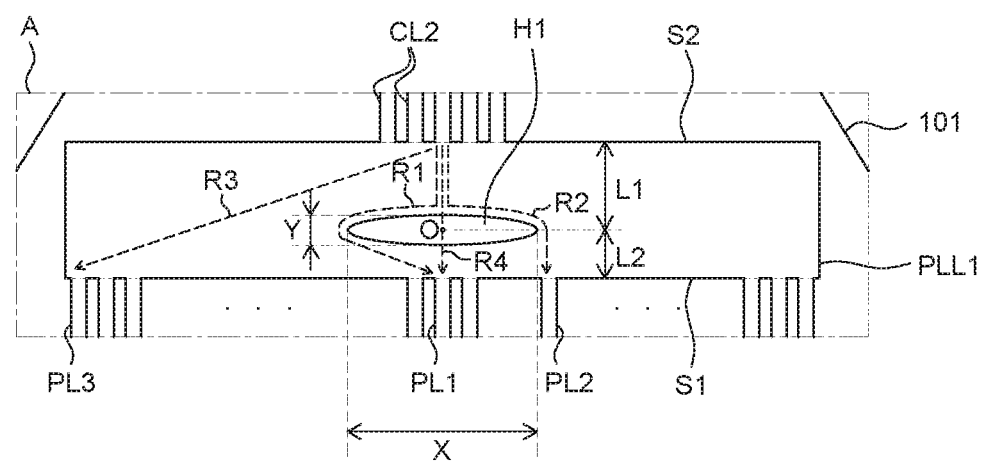
FIG. 2 is an enlarged view of an area A of FIG. 1 according to an embodiment of the present disclosure.

FIG. 2 is an enlarged view of an Area A of FIG. 1.

Referring to FIG. 2, the first hole H1 is disposed at a center portion of the first power link line PLL1 in the first inactive area NAL The second connection line CL2 of the second power link line PLL2 is connected to the center portion of the first power link line PLL1. Therefore, a center O of the first hole H1 may be disposed on the same line as the second power link line PLL2. For example, the first hole H1 may be disposed in the first power link line PLL1 to correspond to a center or middle of the second power link line PLL2.

Further, the plurality of power lines PL is connected to the first power link line PLL1. The straight distance between the second power link line PLL2 and the first power line PL1, which is on the same line as the second power link line PLL2, is the shortest among the plurality of power lines PL. Further, since the center O of the first hole H1 is disposed on the same line as the second power link line PLL2, the center O of the first hole H1 may overlap the shortest straight route between the second power link line PLL2 and the first power line PL1.

Since the first hole H1 has an oval shape, the horizontal length X of the first hole H1 is longer than the vertical length Y of the first hole H1. For example, the length X of the first hole H1 in a horizontal direction, which is the direction in which the first power link line PLL1 extends, is larger than the length Y of the first hole H1 in a vertical direction, which is the direction in which the second power link line PLL2 extends. Further, while the horizontal length X of the first hole H1 is longer than the vertical length Y in this embodiment, the shape of the first hole H1 is not limited thereto.

The first hole H1 is disposed closer to a first side S1, in an area between the first side S1 and a second side S2 of the first power link line PLL1. In other words, between the first side S1, which is adjacent to the active area A/A, and the second side S2, which is the side opposite to the first side S1 in the first power link line PLL1, the first hole H1 is disposed closer to the first side S1. Accordingly, distance L1, along the shortest route from the second power link line PLL2 connected to the second side S2 to the center O of the first hole H1, is longer than a distance L2, along the shortest route from the power line PL connected to the first side S1 to the center O of the first hole H1.

The power voltage, which is fed into the center portion of the first power link line PLL1, to which the second power link line PLL2 is connected, is transmitted to both ends (e.g., opposite sides) of the first power link line PLL1. The power voltage transmitted to both ends of the first power link line PLL1 is dropped due to resistance. When the first hole H1 is disposed closer to the second side S2, the vertical length of the first power link line PLL1 where the power voltage is initially transmitted to becomes narrow, increasing resistance such that the drop in power voltage transmitted to the ends of the first power link line PLL1 may be further increased. Therefore, the power voltage supplied to the plurality of power lines PL may be decreased overall. Therefore, the first hole H1 is disposed closer to the first side S1 to increase the width of the first power link line PLL1 at the point where power voltage is initially transmitted into the first power link line PLL1, in order to lower the drop in the overall amount of power voltage initially fed into the first power link line PLL1.

Further, since the first hole H1 is disposed in the first power link line PLL1, the power voltage transmitted from the second power link line PLL2 to some of the plurality of power lines PL may follow a detour or path along an outer periphery of the first hole H1.

A first route R1, second route R2, and third route R3 illustrated in FIG. 2 indicate power voltage transmission routes from the second power link line PLL2 to the first power line PL1, second power line PL2, and third power line PL3, respectively, along the first power link line PLL1.

The first route R1 is a route in the first power link line PLL1 through which the power voltage is transmitted from the second connection line CL2 of the second power link line PLL2 to the first power line PL1. The first route R1 is connected to the first power line PL1 via a route along approximately half of the outer periphery of the first hole H1. This is in contrast to the shortest straight route between the second connection line CL2 and the first power line PL1 which would have been the shortest route among the shortest straight routes between the second connection line CL2 and the plurality of power lines PL.

The second route R2 is a route in the first power link line PLL1 through which the power voltage is transmitted from the second connection line CL2 of the second power link line PLL2 to the second power line PL2. The second route R2 is connected to the second power line PL2 via a route along a part of the outer periphery of the first hole H1.

As described above, the first route R1 is a route through which power voltage is transmitted from the second connection line CL2 to the first power line PL1 corresponding to the center O of the first hole H1. The second route R2 is a route through which power voltage is transmitted from the second connection line CL2 to the second power line PL2 corresponding to an edge of the first hole H1. The first route R1 is connected to the first power line PL1 via a route along approximately half of the outer periphery of the first hole H1 and the second route R2 is connected to the second power line PL2 via a route along approximately a quarter of the outer periphery of the first hole H1 so that the first route R1 may be longer than the second route R2. Therefore, the drop in the amount of power voltage transmitted along the first route R1, which may now be longer than the second route R2, may be higher than experienced along the second route R2.

The third route R3 is a route in the first power link line PLL1 through which power voltage is transmitted from the second connection line CL2 of the second power link line PLL2 to the third power line PL3. As the third power line PL3 is connected to the end of the first power link line PLL1, among the shortest straight routes between the second connection line CL2 of the second power link line PLL2 and the plurality of power lines PL, the shortest straight route from the second connection line CL2 to the third power line PL3 would be the longest.

Further, routes through which power voltage is transmitted to some of the plurality of power lines PL, which do not overlap the first hole H1, may transmit the power voltage without detouring as a result of the first hole H1. In other words, routes that are not extended or detoured as a result of the first hole H1 may not experience any drop in the amount of the power voltage transmitted to their corresponding plurality of power lines PL.

A fourth route R4 is a virtual route in the first power link line PLL1 through which power voltage would be transmitted from the second connection line CL2 of the second power link line PLL2 to the first power line PL1, were there no first hole H1 in the first power link line PLL1. The fourth route R4 may be the same route as the shortest straight route from the second connection line CL2 of the second power link line PLL2 to the first power line PL1.

When the first route R1 and the fourth route R4 are compared, the first route R1 and the fourth route R4 are routes through which the power voltage is similarly transmitted from the second connection line CL2 of the second power link line PLL2 to the first power line PL. However, since the first route R1 detours along the outer periphery of the first hole H1, the first route R1 is longer than the fourth route R4. Therefore, the power voltage drop experienced along the first route R1, which is longer than the fourth route R4, may be higher than along the fourth route R4.

When there is no first hole H1 in the first power link line PLL1, the drop in the amount of the power voltage transmitted along the fourth route R4 is may be the lowest among the routes to the other plurality of power lines PL. However, if a first hole H1 is disposed on the first power link line PLL1, the drop in the amount of power voltage transmitted to the first power line PL1 may be increased. In other words, the first hole H1 causes electrons to have to follow along a longer route in order to reach the first power line PL1.

When the first route R1 and the third route R3 are compared, the first route R1 is a route through which power voltage is transmitted to the first power line PL1, which has the shortest straight route from the second power link line PLL2. Further, the third route R3 is a route through which power voltage is transmitted to the third power line PL3, which has the longest straight route from the second power link line PLL2.

So while the straight distance from the second power link line PLL2 to the first power line PL1 is shorter than the straight distance to the third power line PL3, the first route R1 detours around the first hole H1 so that the length of the route is increased and the power voltage drop in the first route R1 may be substantially equal to the power voltage drop in the third route R3. For example, the width and the area of the first hole H1 may be determined such that the power voltage drop in the first route R1 is substantially equal to the power voltage drop in the third route R3, resulting in the power voltage supplied to the first power line PL1 being substantially equal to the power voltage supplied to the third power line PL3. In other words, the location, placement, and size dimensions of the first hole H1 can cause electrons following from the second connection line CL2 to each of the first, second, and third power lines PL1, PL2 and PL3 to all follow along routes through the first power link line PLL1 having similar lengths, causing each of the first, second and third power lines PL1, PL2, and PL3 to experience power voltage drops that are substantially equal to each other. In this way, substantially the same power voltage level can be supplied to each of the first, second, and third power lines PL1, PL2 and PL3, even when the first and third power lines PL1 and PL3 are positioned far away from the center of the first power line PLL1, where the power voltage is initially transmitted by the second connection line CL2.

The display device has various implementations such as in monitors, televisions, smart phones, or watches, and display devices with large display areas and reduced volumes and weight are being studied. Among such studies is a study for reducing the bezel size of display devices. In order to reduce bezel size, technologies for bending an inactive area of a substrate (e.g., placing circuit boards behind the display panel) or reducing the size of the inactive area of substrates are used. Therefore, a design for reducing the input area for power voltage and reducing the number of wiring lines for transmitting such is being studied. The state of the art was to reduce the input area of the power voltage and the number of wiring lines for transmitting such by implementing a first power link line extending to the left and right sides in the first inactive area above the active area, in order to uniformly transmit the power voltage into the center of the entire active area.

However, there is a problem in that there is a difference in the power voltage transmitted to the power lines connected to the center portion of the first power link line and the power lines connected to the ends (e.g., opposite sides) of the first power link line. Specifically, the route through which power voltage is transmitted to the power lines connected to the center portion of the first power link line is the shortest, and the route through which power voltage is transmitted to the power lines at the ends of the first power link line is the longest. Therefore, there may be a difference in power voltage between the power lines at the center portion of the first power link line and the power lines connected at the ends of the first power link. As described above, when power voltage is not uniformly transmitted to the plurality of pixels throughout the active area, luminance imbalance may be caused, resulting in the deterioration of the reliability of the display device.

Therefore, in the display device 100 according to an embodiment of the present disclosure, the first hole H1 is disposed in the first power link line PLL1 to mitigate the differences in the power voltage drop between the center portion, left portion, and right portions of the active area A/A. The first hole H1 is disposed to correspond to the point where power voltage is initially transmitted into the first power link line PLL1, which is where the second power link line PLL2 connects to the first power link line PLL1. Further, the route by which power voltage is transmitted to the first power line PL1, which has the shortest straight distance (e.g., as the crow flies) from the second power link line PLL2, detours along a path around the first hole H1. The route through which the power voltage is transmitted to the first power line PL1 is therefore elongated, such that there is in a decrease in the amount of power voltage transmitted therefrom. As such, the power voltage transmitted to the third power line PL3, which has the longest straight distance from the second power link line PLL2, may be substantially equal to the power voltage supplied to the first power line PL1, which has the shortest straight route from the second power link line PLL2. Accordingly, in the display device 100 according to the embodiment of the present disclosure, the first hole H1 is disposed at a point corresponding to where power voltage is first supplied to the first power link line PLL1 to reduce the difference in power voltage drop among the plurality of power lines PL connected to the entire first power link line PLL1. Therefore, in the display device 100 according to the embodiment of the present disclosure, the uniformity of the power voltage supplied to the entire active area A/A may be improved, and an image having a more uniform luminance may be implemented.

Figure 3:
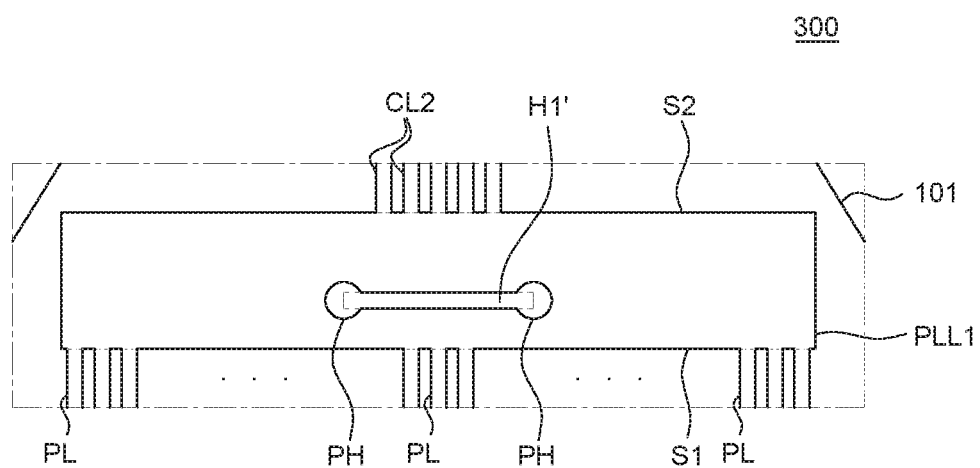
FIG. 3 is an enlarged view of an area A of a display device according to another embodiment of the present disclosure.

FIG. 3 is an enlarged view of an area A of a display device according to another embodiment of the present disclosure. The display device 300 of FIG. 3 has a first hole H1' having a different shape from the first hole H1 featured in the display device 100 of FIG. 1. Because the other configurations are substantially the same, redundant descriptions will be omitted or briefly described.

Referring to FIG. 3, the first hole H1' further includes additional holes PH disposed at both ends of the first hole H1' (e.g., opposite sides of the first hole H1'). In other words, additional holes PH are further disposed at both ends of the first hole H1', which otherwise has a rectangular shape, resulting in the first hole H1' having the shape of a dumbbell or barbell. That is, the first hole H1' has a shape in which the vertical length at both ends of the first hole H1' are greater than the vertical length at the center portion of the first hole H1'.

When an edge of the first hole H1' is sharp (e.g., has sharp corners), electric charges may become concentrated at each edge so that static electricity may be generated and build up. Further, stress may become concentrated at each edge or corner of the first hole H1', resulting in cracks to the first power link line PLL1.

Therefore, the display device 300 according to an embodiment of the present disclosure further includes additional holes PH disposed at each end of the first hole H1'. The first hole H1' is longer in the horizontal direction than in the vertical direction, such that charges may be concentrated on the edges of both ends of the first hole H1' and static electricity may be generated. Further, since both ends of the first hole H1' are narrow, the first power link line PLL1 may be vulnerable to cracks. Therefore, in the display device 300 according to an embodiment of the present disclosure, additional holes PH are disposed at both ends of the first hole H1' so that the charges concentrated at both ends of the first hole H1' are reduced to minimize the generation of static electricity. Further, since the additional holes PH disposed at both ends of the first hole H1' are expanded, the concentration of stress is reduced. Therefore, cracks to the first power link line PLL1 may be reduced or prevented.

Figure 4:
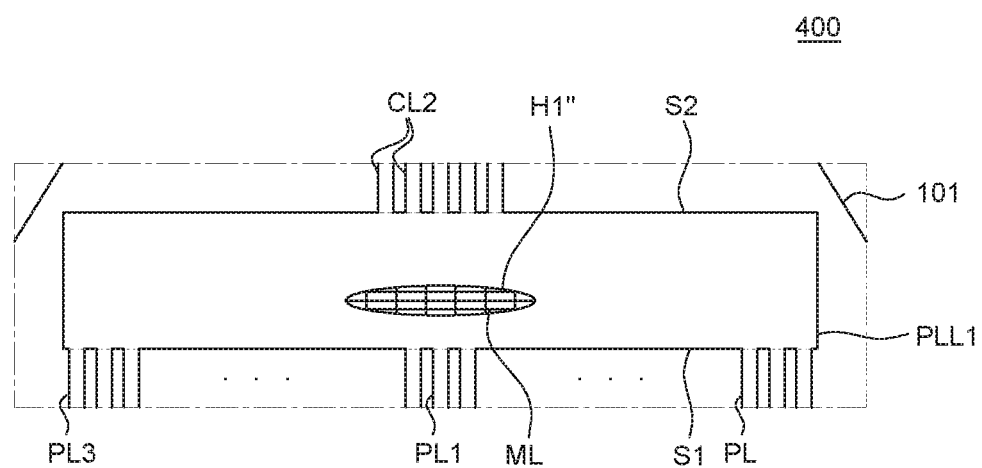
FIG. 4 is an enlarged view of an area A of a display device according to still another embodiment of the present disclosure.

FIG. 4 is an enlarged view of an area A of a display device according to still another embodiment of the present disclosure. The display device 400 of FIG. 4 is different from the display device 100 of FIG. 1 in that it has a mesh line ML (e.g., a wire mesh) in the first hole H1''. The other configurations are substantially the same, so redundant descriptions will be omitted or briefly described.

Referring to FIG. 4, the first power link line PLL1 further includes a mesh line ML disposed in the first hole H1". When power voltage, which is fed into the first power link line PLL1, is subsequently transmitted to the first power line PL1, the power voltage may be supplied via the route having the shortest straight distance from the second connection line CL2 through the mesh line ML in the first hole H1", instead of detouring around the first hole H1".

Relative to the other lines in the first power link line PLL1 transmitting power voltage to the other plurality of power lines (PL2 and PL3), the mesh line ML is thinner and, as a result, has a higher resistance. Therefore, even if the length of the route of the power voltage transmitted to the first power line PL1 from the second conductive line CL2 of the second power link line PLL2 is shorter than the routes to the other plurality of power lines (PL2 and PL3), the drop in the power voltage transmitted thereto may be equally high. Therefore, the drop in the power voltage transmitted to the first power line PL1 may be substantially equal to the drop in the power voltage transmitted to the third power line PL3.

The display device 400 according to an embodiment of the present disclosure includes a mesh line ML in the first hole H1" of the first power link line PLL1. Power voltage may be transmitted to the first power line PL1 through the shortest straight route through the mesh line ML in the first hole H1" without detouring around the first hole H1". However, since the resistance of the mesh line ML is high, the power voltage transmitted through the mesh line ML may be subject to an equal or similar amount of drop in power voltage, as experiences along the route by which power voltage is transmitted to the third power line PL3. In this way, the display device 400 according to an embodiment of the present disclosure, the mesh line ML having a high resistance is disposed in the first power link line PLL1, and despite the shorter distance of the route by which power voltage is transmitted to the first power line PL1, relative to the route by which power voltage is transmitted to the other plurality of power lines (PL2 and PL3), the power voltage drop experienced along the route of the ML may be increased. Therefore, the differences in the amounts of power voltage drop experienced along the different first power link line PLL1 routes to each of the power lines PL is reduced, improving the uniformity of the power voltage transmitted to the active area A/A and images with more uniform luminance may be implemented.

Further, in addition to the power link line PLL, a data link line and data lines may be disposed on the substrate 101 of the display device 400. The data link line and data lines transmit data voltage from the driver IC 112 to the plurality of pixels of the active area A/A. The data link line is disposed in the inactive area N/A and the data lines are disposed in the active area A/A.

In the inactive area N/A, the data link line and the power link line PLL may overlap. For example, in the first inactive area NA1, the first power link line PLL1 and the data link line may overlap each other. When the first power link line PLL1 and data link line overlap, parasitic capacitance may be generated between them. Further, an RC load from the data voltage supplied to the data link line may be generated due to this parasitic capacitance. In this situation, there may be a deviation in the RC loads between the portions of the data link line that do not overlap the first power link line PLL1 due to the first hole H1", where the RC loads may simply pass through the first hole H1", and the portions of the data link line that do not pass through the first hole H1". Therefore, in the display device 400 according to an embodiment of the present disclosure, the mesh line ML is disposed in the first hole H1' of the first power link line PLL1 to cause the first power link line PLL1 to at least partially overlap the data link line to potentially reduce such an RC load deviation.

Figure 5A:
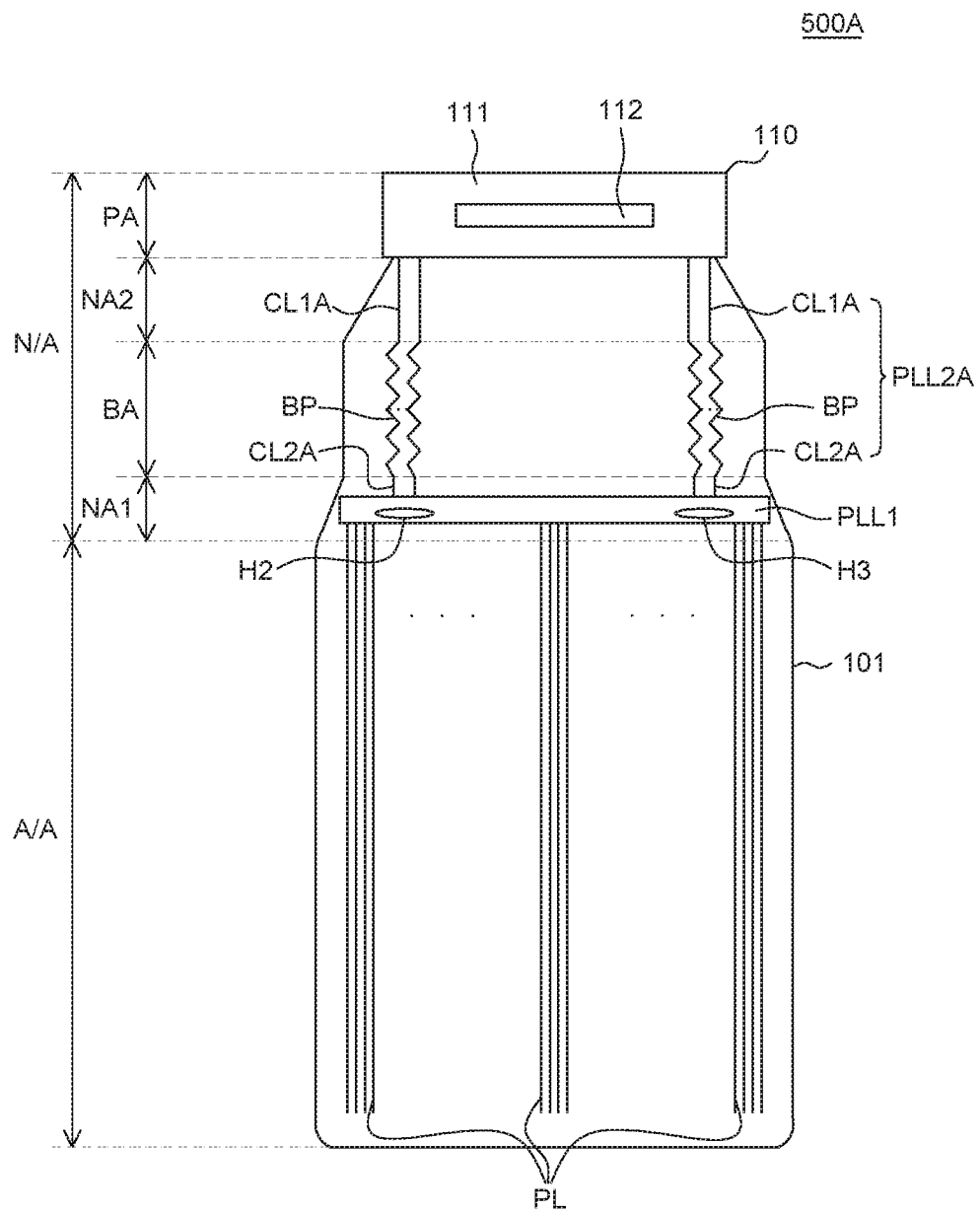
FIGS. 5A to 5C are plan views of a display device according to embodiments of the present disclosure.
Figure 5B:
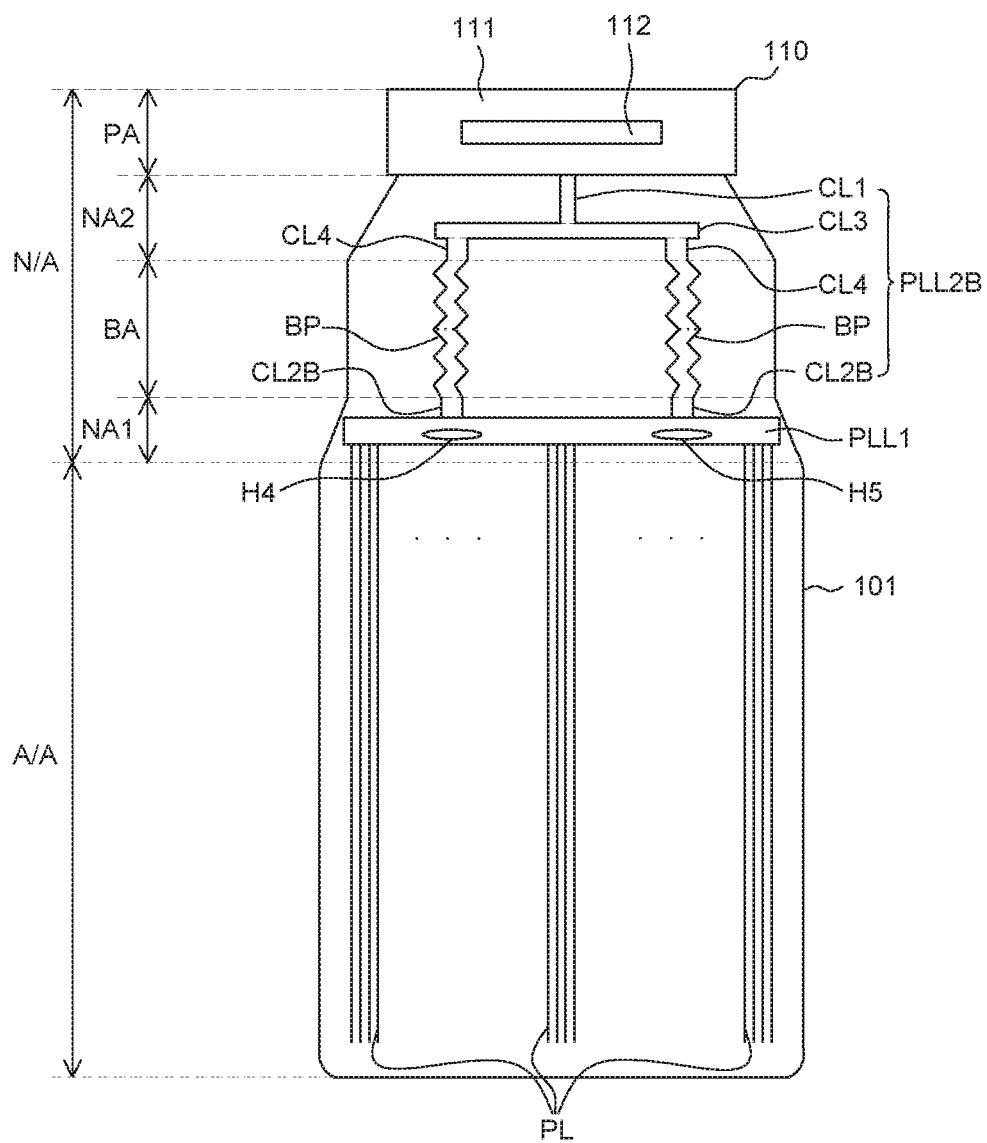
Figure 5C:
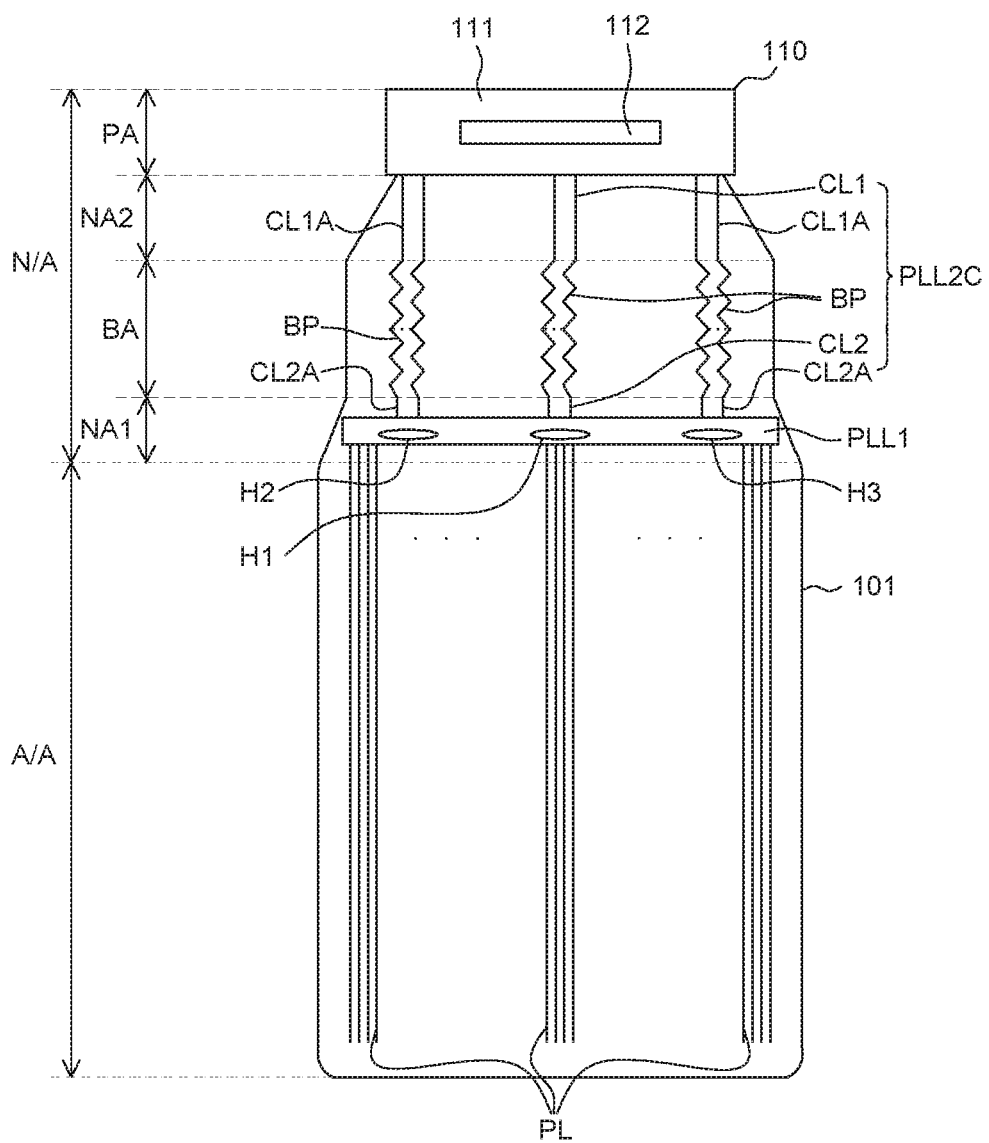

FIG. 5A is a plan view of a display device according to still another embodiment of the present disclosure, FIG. 5B is a plan view of a display device according to another embodiment of the present disclosure, and FIG. 5C is a plan view of a display device according to still another embodiment of the present disclosure. As compared with the display device 100 of FIG. 1, in display devices 500A, 500B, and 500C of FIGS. 5A, 5B, and 5C, the number of holes in the first power link line PLL1 is different, and the arrangement of the second power link lines PLL2A, PLL2B, and PLL2C are different from that of the display device 100 of FIG. 1. However, as the other configurations are substantially the same as the display device 100 of FIG. 1, redundant descriptions will be omitted or briefly described.

Referring to FIG. 5A, the second power link lines PLL2A in the display device 500A are disposed at both ends (e.g., opposite sides) of the inactive area N/A to be connected to both ends of the first power link line PLL1.

For example, the first connection lines CL1A are connected at both ends (e.g., opposite sides) of the pad area PA at both ends (e.g., opposite sides) of the second inactive area NA2. Bending patterns BP connected to the first connection lines CL1A are also disposed at both ends of the bending area BA. Second connection lines CLA2 extending from the bending patterns BP toward the first inactive area NA1 are also at both ends (e.g., opposite sides) of the first inactive area NA1. Therefore, the second power link line PLL2A, which includes the first connection lines CL1A, the bending patterns BP, and the second connection lines CL2A, may be connected to both ends of the first power link line PLL1, which extends to both ends of the first inactive area NA1.

The first power link line PLL1 includes a second hole H2 and a third hole H3 disposed at both ends of the first power link line PLL1 (e.g., at opposite sides). For example, the second hole H2 and the third hole H3 are disposed to correspond to the second power link lines PLL2A (e.g., the holes are each located adjacent to or across from where the corresponding second power link lines PLL2A connect to the first power link line PLL1). Therefore, the second power link lines PLL2A, the center of the second hole H2, and the center of the third hole H3 may be disposed on the same line.

Referring to FIG. 5B, in display device 500B, the second power link line PLL2B includes a first connection line CL1, a third connection line CL3, fourth connection lines CL4, bending patterns BP, and second connection lines CL2B. The first connection line CL1 is on the center portions of the pad area PA and the second inactive area NA2.

The first connection line CL1 is connected to a center portion of the third connection line CL3. Specifically, the third connection line CL3 may extend from an end portion of the first connection line CL1 toward both ends (e.g., opposite sides) of the second inactive area NA2. Each end of the third connection line CL3 is between the center portion and each end of the second inactive area NA2. That is, the distance from the center portion of the third connection line CL3 to each end of the third connection line CL3 may be equal to the distance from each respective end of the third connection line CL3 to the closest edge of the second inactive area NA2.

In FIG. 5B, even though it is illustrated that the third connection line CL3 does not completely extend to the outermost edges of the second inactive area NA2, the third connection line CL3 may extend all the way to the outermost edges of the second inactive area NA2, but is not limited thereto.

The fourth connection lines CL4 may be between the center portion and both ends of the second inactive area NA2, respectively. The fourth connection lines CL4 are wiring lines connected to both ends of the third connection line CL3, extending toward the bending area BA. The fourth connection lines CL4 may be connected to the bending patterns BP of the bending area BA.

The bending patterns BP are disposed between a center portion and both edges of the bending area BA, respectively. The bending patterns BP are connected to the fourth connection lines CL4 and the second connection lines CL2B.

The second connection lines CL2B are disposed between the center portion and both edges of the first inactive area NA1, respectively. The second connection lines CL2B are wiring lines connected to the bending patterns BP and extend into the first inactive area NA1, where they are connected to the first power link line PLL1.

Therefore, the first connection line CL1 of the second power link line PLL2B is disposed at the center portion of the inactive area N/A. The third connection line CL3, extending from the end portion of the first connection line CL1 towards both edges of the inactive area N/A, connects to the fourth connection lines CL4, the bending patterns BP, and the second connection lines CL2B, which may be disposed between the center portion and both edges of the inactive area N/A.

The second connection lines CL2B of the second power link lines PLL2B are connected to a point other than the center portion and both ends of the first power link line PLL1. For example, the second connection lines CL2B may be connected to points corresponding to the one quarter point and three quarters point of the first power link line PLL1, but is not limited thereto.

The first power link line PLL1 includes a fourth hole H4 and a fifth hole H5 disposed to correspond to the second power link lines PLL2B (e.g., where the second connection lines CL2B connect to the first power link line PLL1). A center of the fourth hole H4 and a center of the fifth hole H5 may be disposed on the same line as the corresponding second power link line PLL2B.

Referring to FIG. 5C, in the display device 500C according to another embodiment of the present disclosure, the second power link lines PLL2C are disposed at a center portion of the inactive area N/A and at both ends (e.g., opposite sides) of the inactive area N/A and connect to a center portion and both ends of the first power link line PLL1.

The first connection lines CL1 and CL1A are connected to the center portion and both ends of the pad area PA in the second inactive area NA2. Bending patterns BP connected to the first connection lines CL1 and CL1A are also disposed at the center portion and both ends of the bending area BA. Second connection lines CL2 and CL2A which extend from the bending patterns BP toward the first inactive area NA1 are also disposed at the center portion and both ends of the first inactive area NA1. Therefore, the first connection lines CL1 and CL1A, the bending patterns BP, and the second connection lines CL2 and CL2A may be respectively connected to the center portion and both ends of the first power link line PLL1, which extends to both edges of the first inactive area NA1.

The first power link line PLL1 includes a first hole H1, a second hole H2, and a third hole H3. For example, the first hole H1, the second hole H2, and the third hole H3 are disposed to correspond to each of the second power link lines PLL2C (e.g., where each second connection line CL2 of the second power link line PLL2C connects to the first power link line PLL1). A center of the first hole H1, a center of the second hole H2, and a center of the third hole H3 may be disposed on the same line as the corresponding second power link line PLL2C (e.g., their centers are intersected by the same imaginary line).

In the display devices 500A, 500B, and 500C according to embodiments of the present disclosure, the second power link lines PLL2A, PLL2B, and PLL2C connected to the driver IC 112 may have different arrangements depending on the design of the driver IC 112. In the display device 500A of FIG. 5A, the second power link lines PLL2A are connected to both ends of the first power link line PLL1 and correspondingly, the second hole H2 and the third hole H3 are disposed at both ends of the first power link line PLL1. In the display device 500B of FIG. 5B, the second power link lines PLL2B are connected to points corresponding to approximately one quarter and approximately three quarters of the first power link line PLL1 and correspondingly, the fourth hole H4 and the fifth hole H5 are disposed at points corresponding to approximately one quarter and approximately three quarters of the first power link line PLL1. In the display device 500C of FIG. 5C, the second power link lines PLL2C are connected to the center portion and both ends of the first power link line PLL1 and correspondingly, the first hole H1, the second hole H2, and the third hole H3 are disposed at the center portion and both ends of the first power link line PLL1. That is, the power voltage which is initially fed into the first power link line PLL1 of the display devices 500A, 500B, and 500C, regardless of whether in the center portion, either end portion, or any point in between, may be uniformly supplied to the entire active area A/A.

Further, in the display devices 500A, 500B, and 500C according to various embodiments of the present disclosure, the first to fifth holes H1, H2, H3, H4, and H5 are disposed to correspond to where the second power link lines PLL2A, PLL2B, and PLL2C connect to the first power link line PLL1, to increase the drop in the amount of power voltage transmitted to the corresponding power lines PL on the same line as the second power link lines PLL2A, PLL2B, and PLL2C. The power voltage fed from the second power link lines PLL2A, PLL2B, and PLL2C to the first power link line PLL1 detours around each of the first to fifth holes H1 to H5, so that the route through which the power voltage is supplied to the power line PL disposed on the same line as the second power link lines PLL2A, PLL2B, and PLL2C is lengthened. As the route through which power voltage is supplied is lengthened, power voltage drop is also increased. Therefore, the drop in the amount of power voltage transmitted to the power line PL having the longest straight distance from the second power link lines PLL2A, PLL2B, and PLL2C and the drop in the amount of the power voltage transmitted to the power line PL having the shortest straight distance (e.g., as the crow flies) from the second power link lines PLL2A, PLL2B, and PLL2C may be substantially equal to each other. Further, in the display devices 500A, 500B, and 500C according to various embodiments of the present disclosure, the initial power voltage leading-in point to the display devices 500A, 500B, and 500C may vary depending on the model, arrangement, and design of the driver IC 112. The arrangement of the second power link lines PLL2A, PLL2B, and PLL2C and the holes H1, H2, H3, H4, and H5 in the first power link line PLL1 may vary accordingly.

Accordingly, in the display devices 500A, 500B, and 500C according to various embodiments of the present disclosure, regardless of the model, the arrangement, and the design of the driver IC 112, the uniformity of the drop in the amount of power voltage being fed into the power lines PL of the active area A/A may be improved. Therefore, the arrangement position of the second power link lines PLL2A, PLL2B, and PLL2C and the holes H1, H2, H3, H4, and H5 may be freely set according to the model and the design of the driver IC 112, so that the degree of freedom of design may be increased.

Further, the second power link lines PLL2A, PLL2B, and PLL2C are connected to several points of the first power link line PLL1, so that power voltage may be uniformly distributed to the first power link line PLL1. Therefore, heat generation or deformation of the display devices 500A, 500B, and 500C due to excessive current to the first power link line PLL1 may be improved, thus enhancing the performance of the display devices 500A, 500B, and 500C.

The embodiments of the present disclosure can also be described as follows.

According to an aspect of the present disclosure, a display device includes a substrate which includes an active area having a plurality of pixels and an inactive area adjacent to the active area, a plurality of power lines in the active area to supply power voltage to the plurality of pixels, and a first power link line in the inactive area, which is connected to the plurality of power lines, in which the first power link line includes at least one hole.

A horizontal length of the hole may be larger than a vertical length of the hole.

The hole may have an oval shape.

The hole may further include additional holes at both ends of the first power link line.

The first power link line may further include a mesh line in the hole.

The hole may be located closer to a first side of the first power link line that is adjacent to the active area of the first power link line than a second side of the first power link line that is opposite to the first side and farther away from the active area.

The power link line may further include one or more second power link lines in the inactive, which extend from the first power link line in a different direction than the direction in which the first power link line extends, and the hole may be formed to correspond to the second power link line.

The second power link lines and the center of the hole may be located on the same line.

The second power link lines may be disposed at the center portion of the inactive area and/or both ends of the inactive area.

The second power link lines may be disposed between the center portion of the inactive area and both edges of the inactive area.

The distance from each edge of the inactive area to the second power link line may be equal to the distance from the center portion of the inactive area to the second power link line.

The shortest distance from the center of the hole to the second power link line may be longer than the shortest distance from the center of the hole to the power line.

According to an another aspect of the present disclosure, a display device includes a substrate which includes an active area and an inactive area adjacent to the active area, a plurality of power lines provided in the active area, a first power link line in the inactive area, which is connected to a plurality of power lines, and a second power link line extending from the first power link line in a different direction from the first power link line, in which the first power link line includes a hole that increases the length of the route through which power voltage is transmitted to the power lines that have the shortest distance from the second power link line.

The direction in which the second power link line extends may be perpendicular to the direction in which the first power link line extends.

In order to increase the drop in the amount of power voltage transmitted to the power lines having the shortest straight distance from the second power link line, the center of the hole may be disposed to overlap the shortest straight route from the second power link line to the power line.

The shortest distance from the center of the hole to the second power link line may be longer than a shortest distance from the center of the hole to the power line.

The width of the hole in the direction in which the first power link line extends may be larger than the width of the hole in the direction in which the second power link line extends.

The hole may further additional holes disposed at each edge of the hole to reduce static electricity generated at the edge of the hole and to reduce stress which may lead to cracking.

The hole may have the shape of a dumbbell or a barbell.

A mesh line may be disposed in the hole to increase power voltage drop.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only and are not intended to limit the technical concept of the present disclosure. The scope of the technical concept of the present disclosure is not limited thereto. Therefore, the above-described embodiments are illustrative in all aspects and do not limit the present disclosure. The scope of the present disclosure may be interpreted by the appended claims and all the technical spirits in the equivalent range are intended to be embraced by the disclosure.

What is claimed is:

1. A display device, comprising:
   a substrate including an active area having a plurality of pixels and an inactive area adjacent to the active area;
   a plurality of power lines in the active area, and connected to the plurality of pixels;
   a first power link line in the inactive area, and configured to receive a power voltage and transmit the power voltage to the plurality of power lines; and
   a first hole in the first power link line,
   wherein a width of the first hole along a direction in which the first power link line extends is greater than a width of the first hole along a direction perpendicular to the direction in which the first power link line extends.

2. The display device according to claim 1, wherein a length of a major axis of the first hole is greater than a length of a minor axis of the first hole, and
   wherein the length of the major axis of the first hole extends along a same direction in which the first power link line extends.

3. The display device according to claim 2, wherein the first hole is located closer to the active area than the inactive area.

4. The display device according to claim 1, wherein the first hole has one of an oval shape, a dumbbell shape, and a barbell shape.

5. The display device according to claim 1, further comprising:
at least one additional hole in the first power link line,
wherein the at least one additional hole has a same shape as the first hole and is located at an end of the first power link line.

6. The display device according to claim 1, wherein the first power link line further includes a mesh line in the first hole.

7. The display device according to claim 1, wherein the first hole is located closer to a first side of the first power link line and the active area than a second side of the first power link line which is opposite the first side.

8. The display device according to claim 1, further comprising:
one or more second power link lines disposed in the inactive area and extending from the first power link line in a direction different from a direction in which the first power link line extends,
wherein a location of the first hole corresponds to a location of a corresponding second power link line among the one or more second power link lines.

9. The display device according to claim 8, wherein a center of the corresponding second power link line and a center of the first hole are located on a same imaginary line.

10. The display device according to claim 8, wherein a second power link line among the one or more second power link lines is located at a center portion of the inactive area.

11. The display device according to claim 8, wherein two second power link lines among the one or more second power link lines are located adjacent to opposite edges of the inactive area.

12. The display device according to claim 8, wherein at least one second power link line among the one or more second power link lines is located between a center portion of the inactive area and an outermost edge of the inactive area.

13. The display device according to claim 12, wherein the at least one second power link line is equidistant from the center portion of the inactive area and the outermost edge of the inactive area.

14. A display device, comprising:
a substrate including an active area and an inactive area adjacent to the active area;
a plurality of power lines in the active area;
a first power link line disposed in the inactive area and connected to the plurality of power lines; and
a second power link line extending from the first power link line in a direction different than a direction in which the first power link line extends,
wherein the first power link line includes a hole configured to increase a route through which a power voltage travels through from the second power link line to a power line, among the plurality of power lines, positioned closest to the second power link line among the plurality of power lines, and
wherein a mesh line is in the hole, the mesh line having a higher electrical resistance than other adjacent portions of the first power link line.

15. The display device according to claim 14, wherein the second power link line is perpendicular to the first power link line.

16. The display device according to claim 14, wherein a center of the hole is disposed between the second power link line and the power line.

17. The display device according to claim 14, wherein the hole in the first power link line is located closer to the power line than the second power link line and the active area.

18. The display device according to claim 14, wherein a width of the hole along a direction in which the first power link line extends is greater than a width of the hole along a direction in which the second power link line extends.

19. The display device according to claim 14, further comprising:
an additional hole at an edge of the hole and the additional hole is configured to reduce static electricity generated at the edge of the hole.

20. A di splay device, comprising:
a substrate including an active area having a plurality of pixels and an inactive area adjacent to the active area;
a plurality of power lines in the active area, and connected to the plurality of pixels;
a first power link line in the inactive area, and configured to receive a power voltage and transmit the power voltage to the plurality of power lines;
a plurality of second power link lines disposed in the inactive area and extending from the first power link line in a direction different from a direction in which the first power link line extends; and
a plurality of holes in the first power link line,
wherein locations of the plurality of holes correspond to locations of the plurality of second power link lines, respectively.

21. The display device according to claim 20, wherein at least one second power link line among the plurality of second power link lines is located between a center portion of the inactive area and an outermost edge of the inactive area, and
wherein the at least one second power link line is equidistant from the center portion of the inactive area and the outermost edge of the inactive area.

* * * * *